United States Patent [19]
Janoff

[11] Patent Number: 5,716,168
[45] Date of Patent: Feb. 10, 1998

[54] METHOD OF DRILLING HOLES IN PRINTED CIRCUIT BOARDS WITH BACKUP BOARD MATERIAL

[76] Inventor: Marshall A. Janoff, 7714 Grasty Rd., Baltimore, Md. 21208

[21] Appl. No.: 616,918

[22] Filed: Mar. 18, 1996

Related U.S. Application Data

[63] Continuation of Ser. No. 330,264, Oct. 27, 1994, abandoned.

[51] Int. Cl.$^6$ ................................................ B23B 35/00
[52] U.S. Cl. .................. 408/1 R; 156/307.4; 156/323; 269/289 R; 408/87; 428/217; 428/525; 428/530
[58] Field of Search ..................... 156/307.4, 323; 428/217, 530, 525; 408/87, 1 R; 269/289 R

[56] References Cited

U.S. PATENT DOCUMENTS

| | | | |
|---|---|---|---|
| 2,587,171 | 2/1952 | Knewstubb et al. | 156/254 |
| 4,288,491 | 9/1981 | Surzhenko et al. | 428/530 |
| 4,853,273 | 8/1989 | Harris . | |

FOREIGN PATENT DOCUMENTS

| | | | |
|---|---|---|---|
| 452324 | 11/1948 | Canada | 156/323 |

*Primary Examiner*—John J. Gallagher
*Attorney, Agent, or Firm*—Lowe, Price, LeBlanc & Becker

[57] ABSTRACT

A back-up board for use in drilling holes in printed circuit boards is disclosed. The inventive back-up board comprises outer layers of paper impregnated with a high-density resin, and a core consisting of alternating layers of paper impregnated with low-density resin and dry paper.

5 Claims, 5 Drawing Sheets

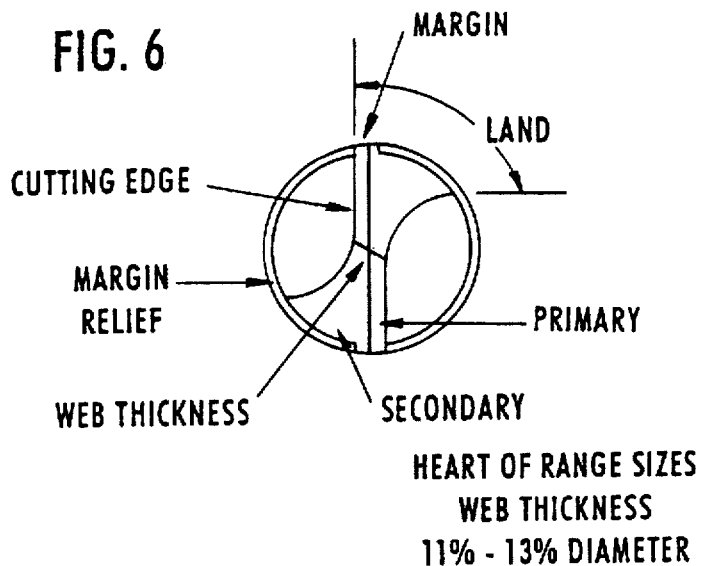
FIG. 6
</br>
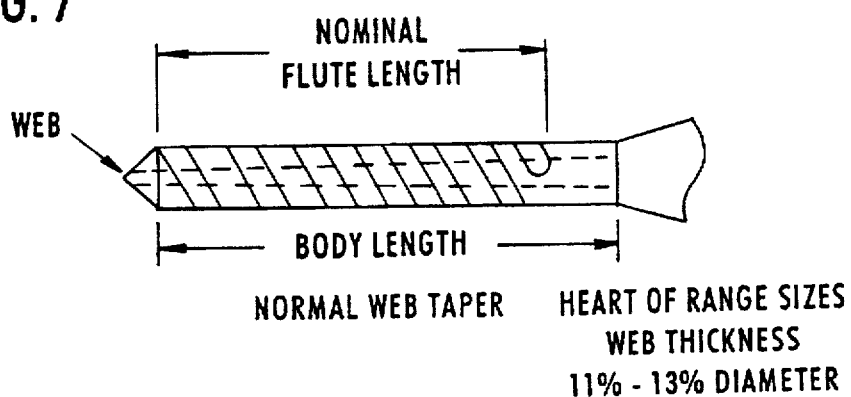
FIG. 7
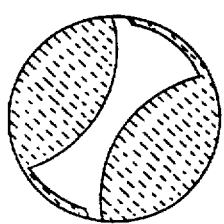
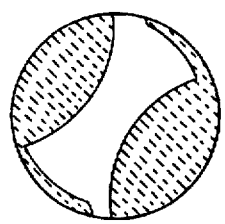
FIG. 8A — FLUTE VOLUME AT POINT
FIG. 8B — FLUTE VOLUME AT CHIP EXIT POINT
HEART OF RANGE SIZES
WEB THICKNESS
11% - 13% DIAMETER

FLUTE VOLUME
AT POINT

FLUTE VOLUME AT
CHIP EXIT POINT

SMALLER DRILL SIZES
WEB THICKNESS
17% - 28% DIAMETER

5,716,168

METHOD OF DRILLING HOLES IN PRINTED CIRCUIT BOARDS WITH BACKUP BOARD MATERIAL

This application is a continuation of application Ser. No. 08/330,264 filed Oct. 27, 1994, now abandoned.

TECHNICAL FIELD

This invention relates to back-up materials, and more particularly, to laminated back-up materials used when drilling holes in printed circuit boards.

BACKGROUND ART

The drilling of holes in single sided, double sided, and/or multilayer circuit board laminates is a particularly critical machining operation. Good quality holes are essential to producing high quality circuit boards. A good quality hole is one that is produced having minimal defects. Such defects typically include resin smear, nail heading, rough hole walls, and inaccuracy in the size or position of the hole on the board. The drilling operation itself can result in problems with the holes, such as surface burrs and epoxy smears. A complete solution to these problems requires the utilization of a board which is attached to the back of the circuit board during the hole drilling operation (a "back-up board").

Most back-up boards are made with a wood core which contains chips and flakes of cellulose and resin which are laminated with phenolic, melamine, epoxy or aluminum cover sheets. Although better than many other products, these materials can leave dust in the drilled holes, aluminum galled to the drill tip, or can cause excessive drill wear.

Solid phenolic back-up boards tend to be very dense and abrasive. They can also cause hole-wall degradation from chip-pressure built up in the drilling process, and can chip and wear the drill bits.

Softer woods, like medium density fiberboard (MDF), can be very dusty, and are not hard enough to prevent burring of the bottom panel of the circuit board being drilled. The hardness of these woods generally range from 65–75 shore-d. Although this material will minimize drill wear, it is not applicable for the higher aspect ratio drilling which is required by many users.

U.S. Pat. No. 4,853,273 discloses a back-up board comprising a corrugated core material made of saturated Kraft paper. The problem with the back-up board of '273, however, is that upon lamination, the corrugated core tends to collapse, thus destroying the purpose and integrity of the core. Additionally, the back-up board of '273 is a thermoset resin impregnated core which fuses upon lamination. Such fusion is undesirable because it increases the core density, thereby increasing the level of contamination left in the hole when the drill bit is removed.

The back-up board disclosed in U.S. Pat. No. 3,700,341 employs a core of pressed wood, such as masonite, covered with a metallic surface, such as aluminum. The masonite, however, is too dense of a material, and results in excessive abrasion and wear to the drill bits. Use masonite also tends to leave debris in the hole. Other methods have been devised in an attempt to eliminate these problems. For example, U.S. Pat. No. 4,269,549 utilizes a metallic corrugated core. The cost such a core material, however, is prohibitive.

OBJECTS OF THE INVENTION

It is an object of the present invention to provide an improved back-up board for use in drilling printed circuit boards.

It is another object of the present invention to provide an improved method of manufacturing a back-up board for use in drilling printed circuit boards.

It is another object of the present invention to provide a back-up board which is cost effective and which allows the drilling of clean, burr-free holes in printed circuit boards.

It is yet another object of the present invention to prolong the useful life of drill bits used for drilling holes in printed circuit boards.

Still other objects and advantages of the present invention will become readily apparent to those skilled in this art from the following detailed description, wherein the preferred embodiment of the invention is shown and described simply by way of illustration of the best mode contemplated for carrying out the invention.

DISCLOSURE OF THE INVENTION

According to the present invention, the foregoing objectives and advantages are attained by a back-up board comprising outer layers constructed of paper impregnated with a high-density resin which results in a hard surface, and a core consisting of layers of dry paper and paper impregnated with a low-density resin. The inventive back-up board's hard outer shell results in the drilling of burr-free circuit board holes, while the low-density resin/dry paper core prevents wood dust and debris from accumulating in the holes and reduces drill wear.

BRIEF DESCRIPTION OF THE DRAWINGS

FIG. 6 top view of drill bits generally ranging in size from #52 –#68, normally referred to as "heart-of-the-range", naming the geometrical components thereof.

FIG. 7 side view of drill bits generally ranging in size from #52–#68, normally referred to as "heart-of-the-range", naming the geometrical components thereof.

FIGS. 8A–8B cross section of drill showing flute volume at the tip and at the exit point of drill bits generally ranging in size from #52–#68, normally referred to as "heart-of-the-range", naming the geometrical components thereof.

DETAILED DESCRIPTION OF THE INVENTION

Figure 2:
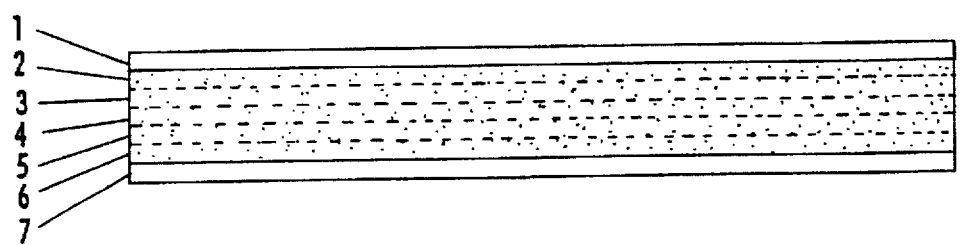
FIG. 2 side sectional view of the components which form the sheet of laminated drill back-up material.

FIG. 2 illustrates the back-up board of the present invention. The invention comprises a plurality of laminated planar sheets on either side of a dry paper core. Outer layers 1 and 7 are resin-impregnated to provide a relatively hard surface on which the circuit board can be supported during drilling. The outer layers each have a thickness of approximately 0.006", and are made of paper impregnated with a resin, such as melamine, to provide a hard surface. Central layers 2, 4 and 6 are made of paper impregnated with a sorer resin, such as phenolic. The invention is not limited to using only these two resin systems. Core layers 3 and 5 are made of dry (unimpregnated) Kraft paper. The low-density central layers 2, 4 and 6 and dry core 3 and 5 each have a thickness of approximately 0.011".

The layers shown in FIG. 2 consist of: melamine-impregnated Kraft paper 1; phenolic-impregnated Kraft paper 2; dry Kraft paper 3; phenolic-impregnated Kraft paper 4; dry Kraft paper 5; phenolic-impregnated Kraft paper 6; melamine-impregnated Kraft paper 7. The back-up board has a hardness, as measured by a durometer, of approximately 95 shore-d. The preferred thickness of the back-up board of the present invention ranges from approximately 0.060"–0.075". However, the invention is not limited to this range. If a greater thickness in the back-up board is required, additional alternating sheets of low-density resin-impregnated paper and dry Kraft paper may be employed. The specific number of layers utilized is a function of the required thickness of the finished laminate.

Figure 3:
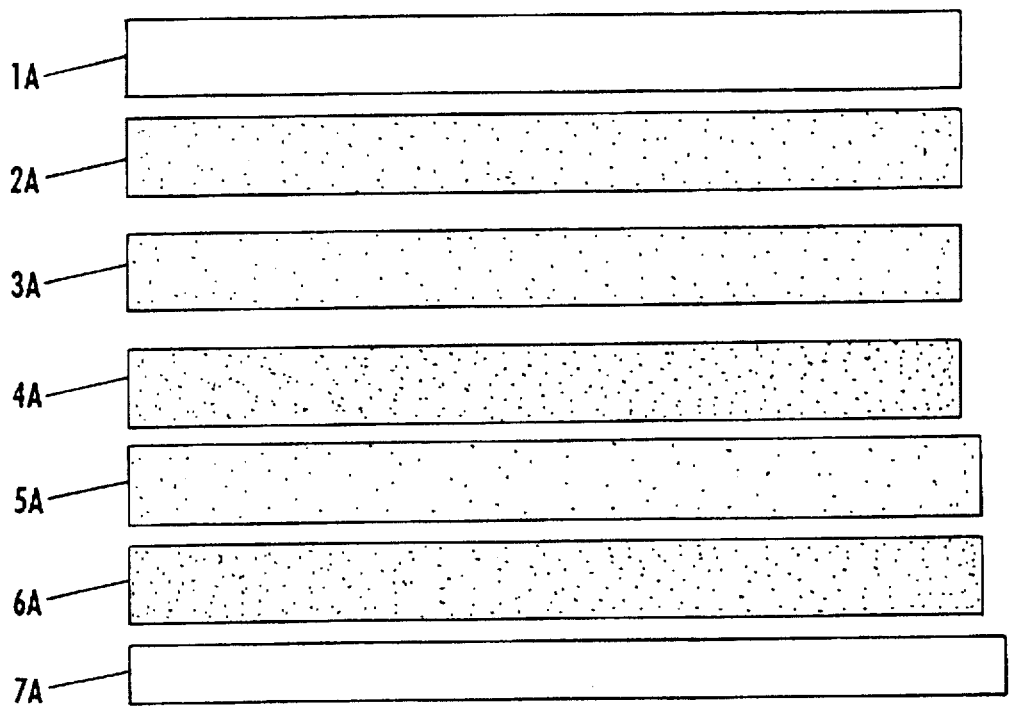
FIG. 3 exploded view of the individual back-up board sheets prior to lamination.

The inventive back-up board may be manufactured by at least two different processes: high pressure platen pressing or continuous pressing. In the high pressure platen method of manufacture, Kraft paper sheets are pre-impregnated in their respective resins to provide the appropriate hardness. Then, as shown in FIG. 3, sheets of impregnated and dry paper are stacked from top layer to bottom layer as follows: melamine impregnated Kraft paper 1 A; phenolic impregnated Kraft paper 2A; dry Kraft paper 3A; phenolic impregnated Kraft paper 4A; dry Kraft paper 5A; phenolic impregnated Kraft paper 6A; melamine impregnated Kraft paper 7A. The specific number of sheets utilized may vary depending upon the required thickness of the finished laminate.

After stacking the paper in this order, the stack of paper is then pressed under high pressure and temperature. It is preferred that the back-up board have a high glossy finish. This result is achieved by pressing the stack with a #8 mirror plate, finished caul sheets, and/or platens. The pressure used in this operation is generally in excess of 350 pounds per square inch (psi), more properly from 800–1000 psi. The temperatures will vary depending on the specific resin systems and the needed times for the resins to properly thermoset (cure). This process will result in the production of a back-up material which has a hard outer surface, and a low-density/dry paper inner core. Furthermore, this method of manufacture will result in a back-up board which may be peeled apart or separated due to the special and unique nature of the board's construction and lamination.

If the manufacturing process is to be conducted on a continuous press, then rolls of hard resin pre-impregnated paper are collated with a less dense resin-impregnated paper and dry Kraft paper, as shown in FIG. 3, 1A through 7A. Again, the individual layers are stacked in the following order (from top to bottom): melamine impregnated Kraft paper 1A; phenolic impregnated Kraft paper 2A; dry Kraft paper 3A; phenolic impregnated Kraft paper 4A; dry Kraft paper 5A; phenolic impregnated Kraft paper 6A; melamine impregnated Kraft paper 7A. As with the platen press manufacturing process, the specific number of sheets utilized in the continuous press process is determined by the required thickness of the finished laminate. In the continuous press manufacturing process, both the resin-impregnated and dry paper sheets are drawn through rollers which bring the sheets into a position to be heated. Heating is commonly done by a large heated drum set at a temperature sufficient to properly cure the resin.

In either method of manufacture, the following results are achieved: A) smooth hard surface sheets, both top 1 and bottom 7 with a mirror plate finish. The resultant combination of the pressure, thermosetting resins and the smooth plates will make the surface very hard: at least a 90 shore-d durometer hardness reading is preferred. B) the core 2–6 will have a lower density than the outer surface, and will not become a solid plastic upon lamination. The core may be peeled apart, since the dry sheets of Kraft paper will only partially absorb the resin from the adjoining resin-impregnated sheets.

The process of drilling printed circuit board laminate is conducted on sophisticated computer-driven machinery. This equipment must be very stable and accurate. Newer technology uses spindles which rotate in excess of 100,000 revolutions per minute. Drill bits are generally made of solid "micro grain" carbide, with cobalt levels of 6% through 10%. These drills are fragile and must be treated accordingly. Some drills are made by combining a stainless steel shank with a solid carbide flute.

Figure 1:
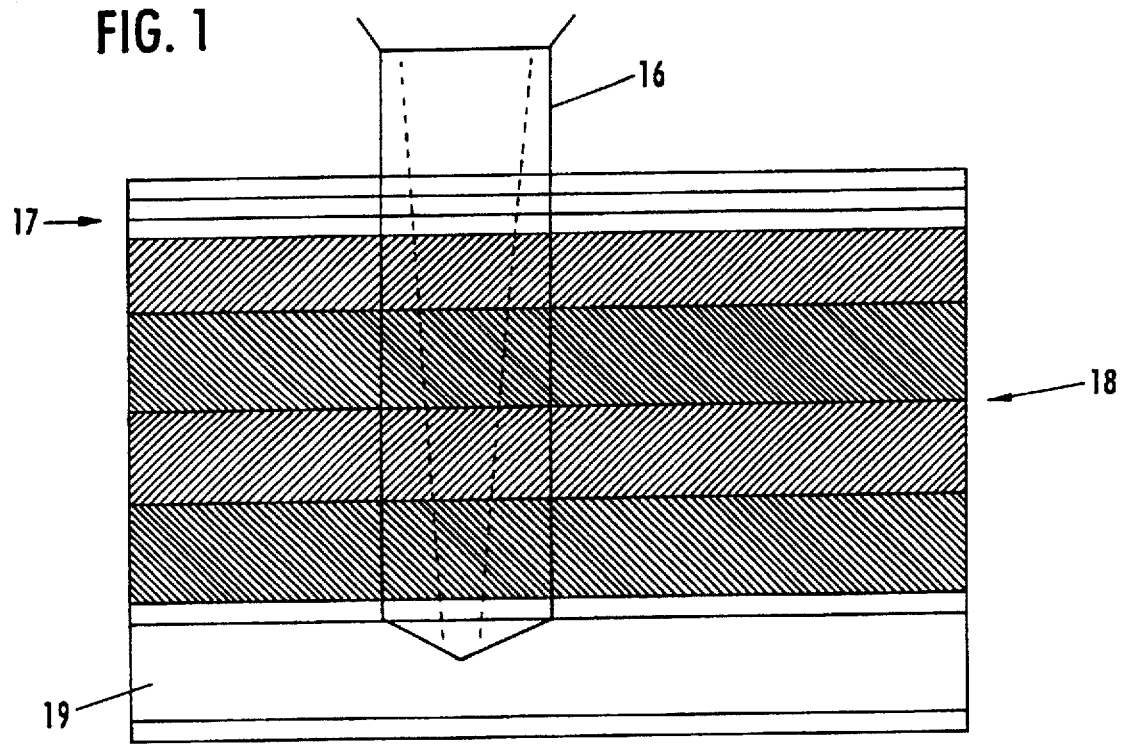
FIG. 1 composite side view of drill penetrating entry, circuit multiple boards, and back-up board.
Figure 4:
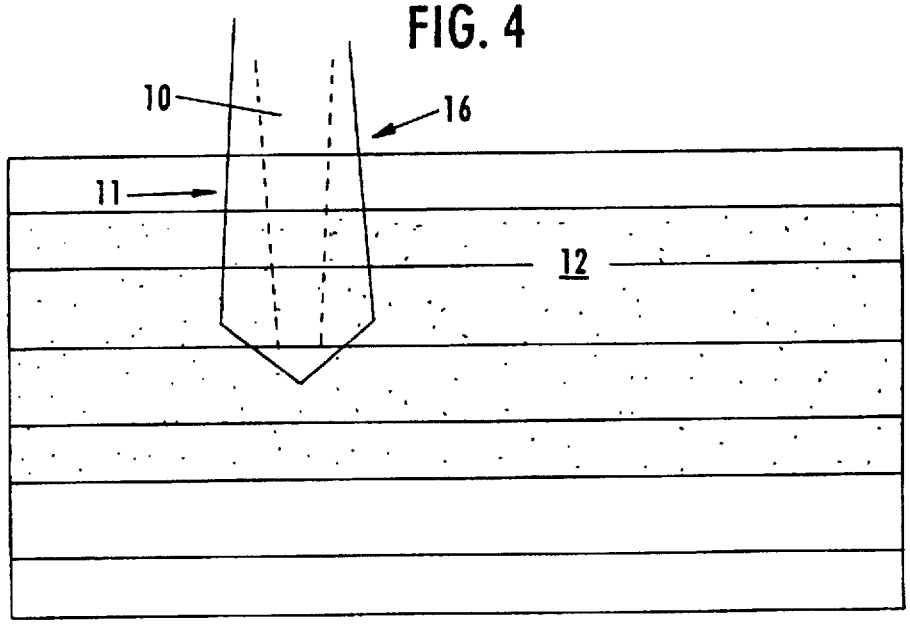
FIG. 4 a cross-sectional view of how the printed circuit board drill enters into the back-up material after drilling through a stack of circuit board laminates.
Figure 5:
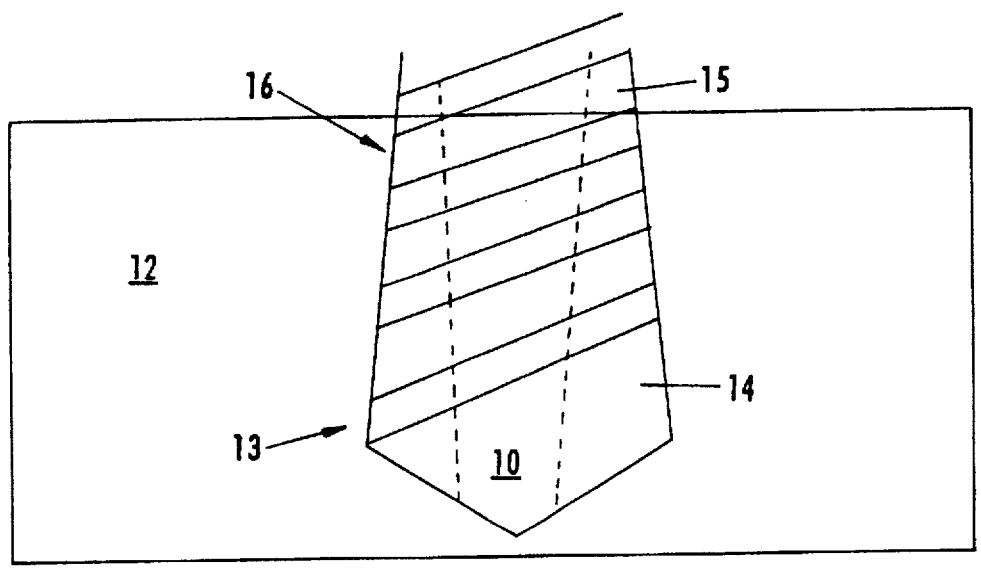
FIG. 5 an illustration of how printed circuit board drill design exacerbates drill chip compression as debris is transported up the drill flutes.

FIG. 1 illustrates a drill penetrating through entry material 17, multiple circuit boards 18, and back-up board 19. The drilling operation itself is performed at very high speeds, and at relatively high rates of drill descent into the printed circuit board. Drill geometry plays a large role in the drilling process. FIGS. 4 and 5 show the basic structure of the drill bit 16. When drill bit 16 descends into entry material 17, circuit boards 18 and back-up board 19, there is a resultant increase in chip (or debris) pressure as the drilled material is transported up the flutes 13. As the drill descends and then ascends, the tip of the drill peels out large volumes 14 of material which is gradually and continually compressed by the web taper 10 as it travels towards the top of the drill 15. This wedge effect not only compresses the debris, but it also creates heat in the process, and forces the debris against and into the hole wall. This effect can cause rough holes or epoxy smear—a condition where the epoxy melts due to excessive drilling temperatures. Should a blockage occur at the top of the drill, material could be extruded forward and blow out the bottom holes of the bottom board. Because it utilizes a low-density resin/dry paper core in the center, the back-up board of the present invention reduces the problems associated with chip pressure.

Additionally, the hard outer surface of the present invention will help to prevent bottom burring that may occur during drilling. The core of the invention is hard enough to support the surface, yet because of its lower density, it will minimize debris compression, resulting in cleaner holes. Used properly, the inventive back-up board will reduce excessive drill wear. After the initial use, the inventive back-up board may be turned over and the bottom surface 7 utilized as the top of the back-up. Moreover, if the inventive back-up board is made to have a thickness of approximately 0.010" to 0.024", it may be utilized as an entry board. Thus, the inventive back-up board presents a very cost-effective alternative to existing back-up boards.

Figure 9:
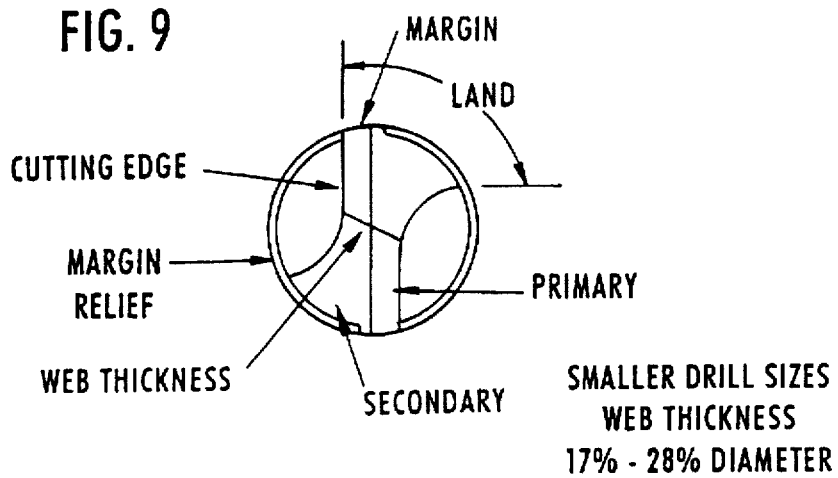
FIG. 9 top view of drill bits generally ranging in size from #69 and smaller, normally referred to as "small-hole drills", naming the geometrical components thereof.
Figure 10:
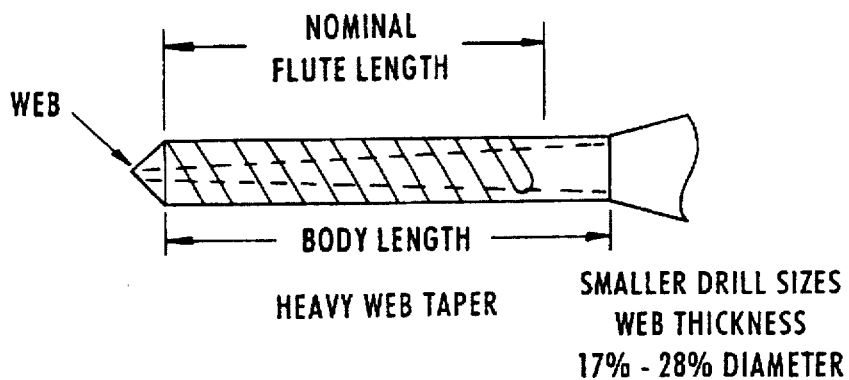
FIG. 10 side view of drill bits generally ranging in size from #69 and smaller, normally referred to as "small-hole drills", naming the geometrical components thereof.
Figure 11A:
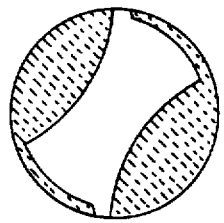
FIGS. 11A–11B cross sections of drill showing flute volume at the tip and at the exit point of drill bits generally ranging in size from #69 and smaller, normally referred to as "small-hole drills", naming the geometrical components thereof.
Figure 11B:
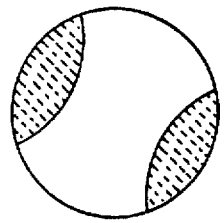

The present invention improves over known back-up boards, such as that shown in U.S. Pat. No. 4,853,273, in that the inventive laminated core is rigid enough in construction to prevent core compression. This is important when drilling very deep small holes, since high aspect ratio drilling results in enormous chip pressure which may extrude debris down the flutes instead of up. FIGS. 9, 10, and 11 show how the design of small-hole drills can exaggerate the compression as compared to heart-of-the-range drills in FIGS. 6, 7, and 8. In high aspect ratio drilling, the compression caused by the drilling can cause the edge of the hole on the bottom panel to tear and burr. Such an occurrence is a major defect since the copper usually tears away from the epoxy wall which bonds them together. Since glass bundles are exposed, plating becomes difficult, increasing the probability of defective connections in the circuit board. The inventive back-up board will reduce burring by reducing the chip pressures caused by high aspect ratio drilling.

While preferred characteristics of the invention have been disclosed, modifications to the disclosed embodiments of the invention, as well as other attributes thereof, may occur to those skilled in the art. Accordingly, the appended claims are intended to cover all embodiments of the invention and modifications to the disclosed embodiments which do not depart from the spirit and scope of the invention.

What is claimed is:

1. A method of drilling holes through a circuit board with a drill bit and a back-up board having first and second outer planar sheets of resin pre-impregnated paper, a plurality of resin pre-impregnated central planar paper sheets disposed between the first and second outer planar sheets, and a plurality of planar dry paper sheets into which the drill bit descends and being respectively disposed between successive ones of said plurality of central planar paper sheets, and wherein the first and second outer sheets, the plurality of central sheath, and the dry paper sheets are bonded together under high pressure and temperature to create hard surface outer sheets having a higher density than the density of the combination of dry and resin impregnated central sheets, comprising the steps of:

positioning a back-up board beneath the circuit board with the first outer planar sheet disposed adjacent the circuit board; and drilling through the circuit board with said drill bit and into the back-up board by penetrating through said first outer planar sheet and through at least one of said central planar paper sheets and into at least one of said dry paper sheets.

2. The method of claim 1, wherein the resin in the pre-impregnated central planar sheets is softer than the resin in the pre-impregnated paper of the first and second outer planar sheets.

3. The method of claiming 1, comprising the further step of penetrating with the drill bit through a second of said central planar paper sheets and through said second outer planar sheet.

4. The method of claim 1, comprising the further step of penetrating with the drill bit through a second of said central planar paper sheets and into a second of said dry paper sheets.

5. The method of claim 1, wherein said first outer planar sheet is approximately 6 mils thick, and each of said central planar paper sheet and said dry paper sheets are approximately 11 mils in thickness.

* * * * *